Feb. 17, 1970 J. E. GUTHRIE ET AL 3,495,324

OHMIC CONTACT FOR PLANAR DEVICES

Filed Nov. 13, 1967

INVENTORS
JOSEPH E. GUTHRIE
ROBERT MARKS
BY S. C. Yeaton
ATTORNEY 3,495,324

OHMIC CONTACT FOR PLANAR DEVICES

Joseph E. Guthrie and Robert Marks, Fairfield, Conn., assignors to Sperry Rand Corporation, a corporation of Delaware Filed Nov. 13, 1967, Ser. No. 686,372
Int. Cl. B01j *17/00;* H01l *5/00*
U.S. Cl. 29—578 11 Claims

ABSTRACT OF THE DISCLOSURE

A method for making a multilayer ohmic contact for planar devices adaptable to face down solder bonding by consecutively evaporating layers of aluminum and copper on a major surface of the planar device, developing a photoresist mask on the copper exclusive of the region where the multilayer contact is to be formed, electroplating copper on the unmasked region, removing the photoresist and etching the evaporated copper and aluminum except in the region beneath the electroplated copper.

BACKGROUND OF THE INVENTION

The present invention relates to a method for forming on a planar device a multilayer ohmic contact suitable for face down solder bonding. Planar devices include structures fabricated in accordance with thin film or thick film techniques in addition to integrated circuits and discrete components such as transistors or diodes formed in semiconductor wafers. Although the invention is applicable to planar devices in general, it is particularly useful with integrated circuits and will therefore be described with reference to such devices.

In the early state of microelectronic art, the circuit components fabricated in semiconductor chips were electrically connected to external circuits by means of a wire bonded at one end to a contact on the chip and at the other end to a terminal on a substrate on which the chip was mounted. Aluminum was generally preferred for the contact material and gold for the connecting wire, while the chip was invariably made of silicon. A thermocompression process, involving the simultaneous application of pressure and heat, was required to connect the gold wire to the aluminum contacts. This was a tedious and time consuming procedure because the wire had to be precisely positioned with respect to each contact and substrate terminal. Aside from the inconvenience of the method, it was discovered that a metallic compound having poor electrical properties developed intermediate the gold and aluminum when these metals were heated in the presence of silicon and further that degradation of the contact was likely to occur as a consequence of the gold wire being deformed by the pressure applied thereto. Hence, other means were investigated for connecting the chip contacts to the substrate terminals. In one method of special interest, known as face down bonding, the chip contacts (and/or substrate terminals) are built up to a uniform height and then the chip is aligned with respect to the substrate so that the mating contacts and terminals are in contacting registration with one another in preparation for bonding either by thermocompression or soldering. Certain problems have been experienced with the thermocompression technique, namely, the necessity for a lengthy fabrication process, such as vacuum evaporation or sputtering, to construct suitable contacts and the tendency for the chip to crack as a result of the pressure used to effect the bond. Thus, face down solder bonding is presently regarded as the preferred method for connecting the chip contacts to the substrate terminals. A recently devised method for fabricating contacts adaptable to face down solder bonding comprises the steps of evaporating a film of solder on the aluminum contacts and then using a jig, which is accurately positioned relative to the wafer, to place solder spheres in the concave formation above each contact. Subsequent heating of the wafer fuses the solder film causing the solder spheres to attach to the aluminum contacts.

SUMMARY OF THE INVENTION

In accordance with the preferred method of the present invention, the aluminum contacts on circuit components fabricated on a glass passivated and hermetically sealed silicon wafer are built up by successive depositions of metallic layers to form multilayer ohmic contacts suitable for face down solder bonding a flip chip to a carrier substrate. More specifically, layers of aluminum and copper are consecutively evaporated on the major surface of the wafer in which the aluminum contacts are located and then a photoresist mask is developed on the copper except in the regions where the multilayer contacts are to be formed. Next, the wafer is immersed in an electrolytic bath operated at a prescribed current for a predetermined length of time to deposit a precisely controlled amount of copper on the unmasked portions of the evaporated copper. Thereafter, the developed photoresist is removed and the evaporated copper and aluminum is etched away except in the region beneath the electroplated copper. As a final step, the wafer is solder dipped to form a solder cap on the deposited copper. Chips obtained from the wafer can thus be face down bonded simply by soldering rather than by thermocompression. Moreover, applying the solder by dipping eliminates the need for a jig and associated precision alignment equipment. In addition, since the major portion of the contact is formed by electroplating, the processing time is reduced substantially from that which is required to build up a contact to the same height by evaporation or sputtering.

BRIEF DESCRIPTION OF THE DRAWINGS

The invention will be described in greater detail with reference to the accompanying drawings wherein identical components are represented by the same numeral designation.

DESCRIPTION OF THE PREFERRED EMBODIMENT

Figure 1:
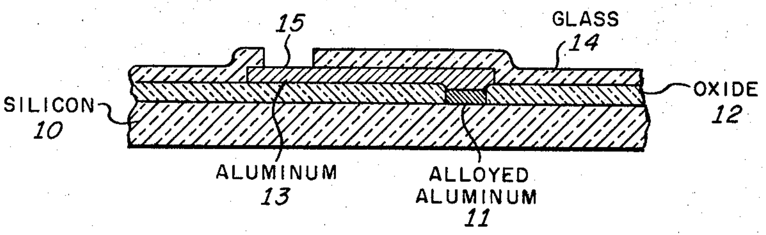
FIG. 1 is a cross-sectional view of a semiconductor device fabricated in accordance with prior art techniques.

Referring to FIG. 1, the method of the present invention will be described, as previously mentioned, with respect to a semiconductor device comprising a silicon wafer 10, alloyed aluminum contact 11 connecting to the components (not shown) formed in the wafer, a silicon oxide passivating layer 12 overlaying the surface of the wafer except in the region of the alloyed contact, aluminum interconnect 13 formed on the passivating layer and a hermetically sealing glass layer 14 overlaying the entire top surface except at the location 15 where the multilayer ohmic contact is to be formed. This device may be constructed by conventional means. The alloyed contact, for instance, can be formed by depositing aluminum on a prescribed region of the wafer and then heating to a temperature close to the silicon-aluminum eutectic so that the aluminum alloys with the silicon and forms a strong, high conductivity bond upon cooling. The interconnect can be formed in a similar manner by depositing aluminum on prescribed regions of the silicon oxide or alternatively by overlaying aluminum on the entire surface of the silicon oxide and then preferentially etching. Operation of the device is enhanced by selecting a hermetically sealing glass having a temperature coefficient of expansion approximately equal to that of the other parts with which it is in contact and preferably characterized by low sodium ion migration to preclude performance degradation of the components formed in the wafer. In addition, if the glass is applied after the alloyed contact has been constructed, it is advisable for it to have a firing point sufficiently below the aluminum-silicon eutectic to avoid damaging the contact.

It should be understood that the silicon oxide passivating layer, aluminum interconnect and hermetic sealing glass are generally not present on other planar devices such as thin films and do not necessarily have to be included as a part of a semiconductor structure. The inventive method could be applied for instance to a semiconductor device consisting solely of the silicon wafer covered by a passivating or hermetic sealing glass except in those regions where contacts are to be formed. In general though, a semiconductor device will include all of the aforementioned parts and the multilayer ohmic contact for face down bonding will be displaced from the position of the alloyed contact as indicated in the drawing.

Figure 2:
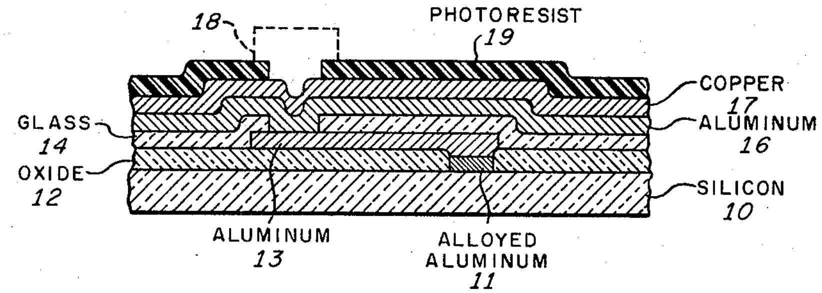
FIG. 2 depicts the semiconductor device of FIG. 1 after completion of the evaporation steps utilized in the present invention.

Referring to FIG. 2, construction of a multilayer ohmic contact by the method of the present invention is commenced by applying a first metallic layer 16, preferably aluminum, to the top surface of the hermetic sealing glass and the exposed interconnect aluminum at contact location 15. Then, a second metallic layer 17 is applied over the aluminum. Copper is preferred for the second layer because it has high conductivity and can be readily plated, a necessary requirement for subsequent processing. Both layers can be applied by standard vacuum evaporation techniques in a single pumpdown with the wafer heated to about 300° C. Successful results have been achieved using C.P. (chemically pure) aluminum wire and OFHC (oxygen free high conductivity) copper wire at a pressure of $10^{-6}$ mm. of mercury. Heating the wafer produces cracks in any oxide film which happens to be present on the interconnect at the multilayer contact location so that the evaporated aluminum can reach the interconnect aluminum and make a good bond therewith. Evaporating both metals in a single pumpdown precludes the formation of an oxide film on the first layer thus assuring a good bond between the aluminum and copper. These metallic layers are typically on the order of 5,000 to 15,000 angstroms thick but are not restricted to that range. The essential requirement is that they be thick enough to facilitate subsequent processing stages. This is achieved by evaporating the aluminum and copper to a sufficient thickness to develop a pure layer of each metal.

Having completed the evaporation stages, the device is then selectively masked by a photosensitive technique. This involves applying a thin coating of a photoresist polymer such as KTFR (Kodak thin film resist) over the entire surface of copper layer 17 and then exposing it to ultraviolet light except in the region where the multilayer contact is to be formed. Thus, if the multilayer contact is to extend in the space marked by the dotted line 18, ultraviolet light will be blocked from the underlying surface region. The unexposed photoresist in the region of the contact is then removed by immersing the device in a photodeveloping solution such as Kodak thin film resist developer thereby forming photoresist mask 19. At this point, the structure of FIG. 2 is ready for electroplating.

Figure 3:
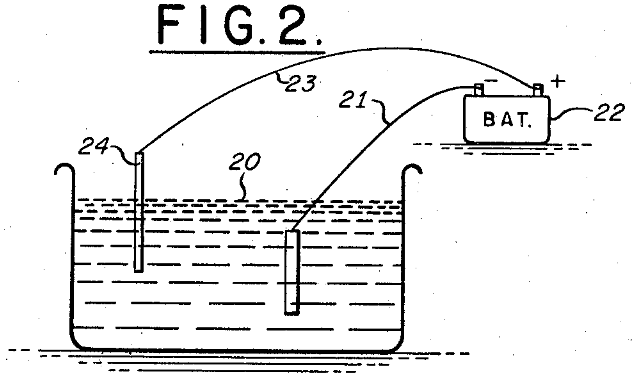
FIG. 3 is a schematic representation of the set up used in the electroplating stage of the invention.
Figure 4:
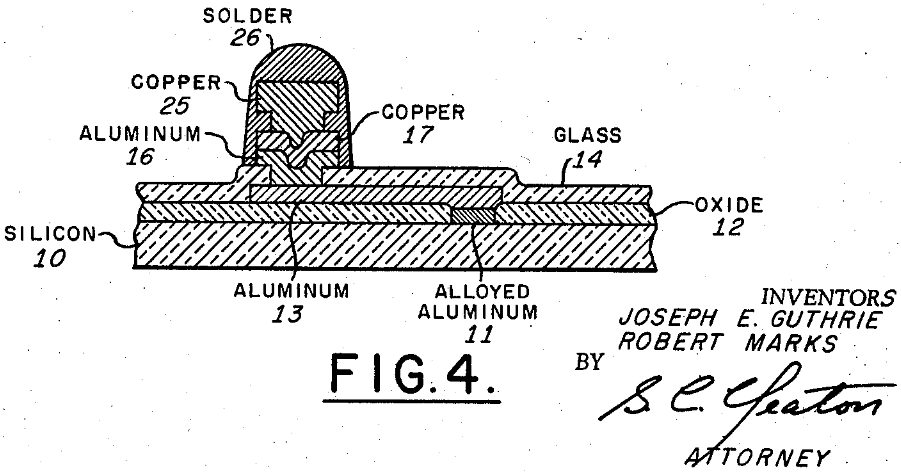
FIG. 4 is a cross-sectional view of the prior art semiconductor device of FIG. 1 in combination with a multilayer ohmic contact formed by the method of the present invention.

Referring to FIG. 3, electroplating is accomplished by immersing the structure of FIG. 2 in an electrolytic bath 20 consisting of 2 ounces of sulphuric acid and 32 ounces of copper sulphate per gallon of water. Insulated lead 21 attached to the negative terminal of battery 22 is connected to the evaporated copper layer on the semiconductor device by scratching away some of the developed photoresist polymer and lead 23 attached to the positive terminal of the battery is connected to copper electrode 24 immersed in the bath. Copper from electrode 24 then replenishes copper in the bath as copper from the solution plates out on the exposed evaporated copper in the region where the multilayer contact is to be formed. This process is continued until an electroplated copper layer 25 is built up to a predetermined height as indicated in FIG. 4. Plating at a current density of 1 amp/square inch for 30 minutes will build up a contact having a height of about 1 mil.

Other metals such as nickel may be used in this step of the method and as an alternative to electroplating the metal may be built up by electroless deposition. Electroplating is preferred, however, particularly the technique of using a common plane for simultaneously plating a plurality of contacts, because it has been observed that plating the contacts individually by either an electroless or electrolytic method does not provide the same degree of uniformity of contact height that is obtained by using a common plate for simultaneous plating. It is believed that non-uniformity of contact height is caused by slight differences in the potentials inherent in the junctions of components fabricated in the wafer. The equipotential plane formed by the solid layers of aluminum and copper assures that equal potentials are applied to each contact and thereby provides uniform electroplating of the copper.

After the contact has been built up by deposition of the copper in the unmasked area, a photoresist stripper such as A44 or A20, manufactured by General Chemical Division of Allied Chemical, Morristown, N.J., is applied to remove the photoresist mask 19. Then, the device is immersed in a dilute solution of nitric acid and water for about 5 to 10 seconds to remove the evaporated copper layer 17 except in the region beneath the electrodeposited material. Some of the copper is also etched away from the top and sides of the electroplated copper contact but this is an insignificant amount, a few thousand angstroms in a contact having a height and width of approximately 250,000 or more angstroms. The evaporated aluminum layer 16 confines the copper etching reaction to the surface region intermediate the evaporated copper and aluminum layers. If the evaporated aluminum layer was not present, the copper etchant would be likely to pass through any voids present in the hermetic sealing glass and cause deterioration of the aluminum interconnect 13. After the copper etching stage has been completed, the device is immersed in a solution of approximately 20% sodium hydroxide and 80% water by volume for about 30 seconds to remove the evaporated aluminum layer except in the region beneath the electro-deposited copper. The device should not be kept in the etching solutions too long to assure that the copper and aluminum will not undercut the area beneath the electroplated layer.

As a final step, solder cap 26 is formed on the electroplated copper. This is accomplished simply by dipping the device in a lead tin solder bath since the solder coats the electroplated copper but does not adhere to the hermetic sealing glass.

In actual practice, the device shown in FIG. 4 would have a plurality of contacts each of the same height so that chips obtained from the wafer could be face down bonded to a carrier substrate simply by applying sufficient heat to melt the solder. In some instances, it may be considered more advisable to form the solder cap on the substrate terminals, in which case the last step of the method would not have to be performed. In any event, high lead content solder having a high melting point would generally be preferred to assure that the chip to substrate bond would not be affected by subsequent inadvertent heating. As an alternative to face down bonding by soldering it should be noted that contacts formed in accordance with the method of the present invention may also be face down bonded by either thermocompression or heating to the eutectic of the chip contacts and substrate terminals. Thermocompression is not ideal, however, for the reasons mentioned hereinbefore and heating to the eutectic is generally not considered practical because the temperatures involved are likely to cause outdiffusion of the dopants in the wafer. Moreover, with the latter method no metal flows during the bonding step as in the case of soldering so the height of the individual contacts must be more precisely controlled.

While the invention has been described in its preferred embodiment, it is to be understood that the words which have been used are words of description rather than limitation and that changes within the purview of the appended claims may be made without departing from the true scope and spirit of the invention in its broader aspects.

We claim:

1. A method for forming on a planar device a multilayer ohmic contact adaptable to face down bonding comprising the steps of (a) applying a first layer of a conductive material to a major surface of the planar device, (b) applying a second layer of a conductive material over the surface of the first layer, (c) placing a mask on the second layer except in the region where the contact is to be formed, (d) depositing a third layer of a conductive material on the second layer in the region where the contact is to be formed, (e) removing the mask, (f) removing the second layer of conductive material except in the region beneath the third layer; and (g) removing the first layer of conductive material except in the region beneath the third layer.

2. The method of claim 1 and further including the step of forming a solder cap over the third layer.

3. The method of claim 1 wherein the third layer is formed by an electroplating process.

4. The method of claim 3 wherein the first and second layers of conductive material are removed by successively immersing the planar device in first and second etchant solutions.

5. The method of claim 4 wherein the mask is placed on the second conductive layer by a photoresist process.

6. The method of claim 5 wherein the first and second layers of conductive material are applied by a vacuum evaporation process.

7. The method of claim 6 wherein the second and third layers are made of the same material.

8. The method of claim 7 wherein the first and second layers are aluminum and copper, respectively.

9. The method of claim 8 and further including the step of dipping the planar device in a solder bath to form a solder cap on the electroplated copper.

10. The method of claim 8 wherein the planar device is a semiconductor structure including a semiconductor material, an alloyed aluminum contact connecting to a circuit component fabricated in the semiconductor material, a passivating glass overlaying the surface of the semiconductor material in which the alloyed contact is located, an aluminum interconnect joined to the alloyed contact and overlaying the passivating glass, and a hermetic sealing material overlaying the aluminum interconnect and passivating glass except at the region where the multilayer contact is to be formed, and the layer of evaporated aluminum is in contact with the exposed region of the aluminum interconnect.

11. The method of claim 10 wherein the electroplating process is performed by immersing the semiconductor structure in an electrolytic bath with a source of energy applied thereto having one terminal connected to the copper layer and the other terminal connected to an electrode immersed in the bath.

References Cited

UNITED STATES PATENTS

| | | | |
|---|---|---|---|
| 3,231,421 | 1/1966 | Schmidt | 29—630 X |
| 3,339,274 | 9/1967 | Saia et al. | 29—589 X |
| 3,383,568 | 5/1968 | Cunningham. | |
| 3,392,442 | 7/1968 | Napier et al. | 29—589 X |
| 3,413,157 | 11/1968 | Kuiper | 29—589 X |
| 3,429,029 | 2/1969 | Langdoo et al. | 29—589 |

OTHER REFERENCES

IBM Technical Disclosure Bulletin, vol. 10, No. 4, September 1967, p. 491—Aluminum Conducting Stripe, by R. P. Sopher.

PAUL M. COHEN, Primary Examiner

U.S. Cl. X.R.

29—589; 317—234